United States Patent
Hurkx et al.

(10) Patent No.: US 6,541,817 B1
(45) Date of Patent: Apr. 1, 2003

(54) TRENCH-GATE SEMICONDUCTOR DEVICES AND THEIR MANUFACTURE

(75) Inventors: Godefridus A. M. Hurkx, Best (NL); Raymond J. E. Hueting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/450,229

(22) Filed: Nov. 29, 1999

(30) Foreign Application Priority Data

Nov. 28, 1998 (GB) ............................................. 9826041

(51) Int. Cl.[7] .............................................. H01L 29/76

(52) U.S. Cl. ...................... 257/330; 257/135; 257/328; 257/329; 257/331; 257/339

(58) Field of Search ................................ 257/135, 328, 257/329, 330, 331, 335, 339, 341; 438/212, 259, 268, 270, 271

(56) References Cited

U.S. PATENT DOCUMENTS

| | | | | |
|---|---|---|---|---|
| 4,754,310 A | | 6/1988 | Coe ............................ | 357/13 |
| 4,914,058 A | | 4/1990 | Blanchard .................... | 437/203 |
| 5,064,777 A | * | 11/1991 | Dhong et al. ................. | 437/52 |
| 5,378,655 A | | 1/1995 | Hutchings et al. ........... | 437/203 |
| 5,981,996 A | * | 11/1999 | Fujishima .................... | 257/335 |
| 6,103,578 A | * | 8/2000 | Uenishi et al. .............. | 438/268 |

FOREIGN PATENT DOCUMENTS

| | | |
|---|---|---|
| DE | 19736981 A | 8/1998 |

OTHER PUBLICATIONS

"Simulated Superior Performances of Semiconductor Superjunction Devices", by T. Fujihira et al, Proceedings of 1998 International Symposium on Power Semiconductor Devices & Ics, pp. 423–426.

* cited by examiner

*Primary Examiner*—Wael Fahmy
*Assistant Examiner*—Wai-Sing Louie
(74) *Attorney, Agent, or Firm*—Steven R. Biren

(57) ABSTRACT

In a trench-gate semiconductor device, for example a cellular power MOSFET, the gate (11) is present in a trench (20) that extends through the channel-accommodating region (15) of the device. An underlying body portion (16) that carries a high voltage in an off state of the device is present adjacent to a side wall of a lower part (20*b*) of the trench (20). Instead of being a single high-resistivity region, this body portion (16) comprises first regions (61) of a first conductivity type interposed with second regions (62) of the opposite second conductivity type. In the conducting state of the device, the first regions (61) provide parallel current paths through the thick body portion (16), from the conduction channel (12) in the channel-accommodating region (15). In an off-state of the device, the body portion (16) carries a depletion layer (50). The first region (61) of this body portion (16) is present between the second region (62) and the side wall (22) of the lower part (20*b*) of the trench (20) and has a doping concentration (Nd) of the first conductivity type that is higher than the doping concentration (Na) of the second conductivity type of the second region (62). A balanced space charge is nonetheless obtained by depletion of the first and second regions (61, 62), because the width (W1) of the first region (61) is made smaller than the width (W2) of the lower-doped second region (62). This device structure can have a low on-resistance and high breakdown voltage, while also permitting its commercial manufacture using dopant out-diffusion from the lower trench part (20*b*) into the lower-doped second region (62) to form the first region (61).

10 Claims, 3 Drawing Sheets

TRENCH-GATE SEMICONDUCTOR DEVICES AND THEIR MANUFACTURE

BACKGROUND OF THE INVENTION

This invention relates to trench-gate semiconductor devices, and particularly but not exclusively to trench-gate power MOSFETs which are insulated-gate field-effect devices. The invention also relates to methods of manufacturing such devices.

Trench-gate semiconductor devices are known, comprising a semiconductor body including a channel-accommodating region of a second conductivity type between source and drain regions of an opposite first conductivity type. The source region is adjacent a major surface of the body, from which surface a trench extends through the channel-accommodating region and into an underlying body portion between the channel-accommodating region and the drain region. A gate is present in the trench and capacitively coupled to the channel-accommodating region adjacent to a side wall of the trench between the gate.

An advantageous trench-gate semiconductor device is described in the ISPSD'98 paper "Simulated Superior Performances of Semiconductor Superjunction Devices" by T. Fujihira and Y. Miyasaka, pages 423 to 426 of the Proceedings of 1998 International Symposium on Power Semiconductor Devices & ICs, Kyoto. In this ISPSD'98 device the body portion comprises first regions of the first conductivity type interposed with second regions of the second conductivity type. This ISPSD'98 device is a particular embodiment of the advantageous general device type that was disclosed in United States patent specification U.S. Pat. No. 4,754,310 (our ref: PHB32740). The interposed first and second regions serve to carry a depletion layer from the drain region to the channel-accommodating region in an off state of the device and to provide parallel current paths along the first regions in a conducting state of the device. A significant improvement is obtained in the relationship between the on-resistance and breakdown voltage of the device, by providing these interposed regions instead of a single high-resistivity body portion as conventionally used. The whole contents of both the ISPSD'98 paper and U.S. Pat. No. 4,754,310 are hereby incorporated herein as reference material.

Published German patent application DE-A-197 36 981 describes the manufacture of other particular trench-gate device embodiments of this advantageous device type having interposed first and second regions. The whole contents of DE-A-197 36 981 are also hereby incorporated herein as reference material. In the manufacturing processes disclosed in DE-A-197 36 981, deep trenches are formed in the semiconductor body, to the depth of the drain region. Both the first and second regions are diffused regions formed at the lower part of the deep trenches by ion-implanting dopants of opposite conductivity types at opposite facing sidewalls of neighbouring trenches and then diffusing the implanted opposite-conductivity-type dopants until they meet to form a p-n junction in the intermediate body portion between the opposite facing sidewalls of the neighbouring trenches. The gate is formed in an upper part of the trench, capacitively coupled to the channel-accommodating region adjacent to a side wall of this upper part.

In practice, the device structures and processes disclosed in DE-A-197 36 981 can be difficult to implement in a volume-manufacturing and commercial context. It is difficult to ion implant dopants at the side walls of the lower part of narrow deep trenches, and so wider trenches than required for the trench-gate itself may be used. Furthermore some of the processes disclosed in DE-A-197 36 981 provide dielectric-filled trenches underneath the source, which may have an undesired effect in increasing the device cell area between neighbouring channels and hence increasing the on-resistance of the device.

SUMMARY OF THE INVENTON

It is an aim of the present invention to provide a trench-gate semiconductor device which is of the advantageous device type that comprises interposed first and second regions and which has a device structure that is particularly appropriate for obtaining a low on-resistance while permitting its manufacture using processes appropriate in a commercial volume-manufacturing context.

According to the present invention, there is provided a trench-gate semiconductor device having the features set out in claim 1.

In trench-gate devices in accordance with the present invention, there are upper and lower parts to the trench. The trench-gate is present in an upper part, with the channel-accommodating region adjacent thereto. The relationship between on-resistance and breakdown-voltage of the device is improved by including the interposed first and second regions between the drain region and the channel-accommodating region, adjacent to a lower part of the trench. The first regions provide parallel current paths between the conduction channel and the drain region, and they are present between the second region and the side wall of the lower part of the trench. The doping concentration of the first conductivity type of the first region is higher than the doping concentration of the second conductivity type of the second region, so further reducing the on-resistance. However the charge of the space-charge region in the depleted body portion can still be adequately balanced because the width of the first region (measured perpendicular to the side wall of the trench) is made smaller than the width of the second region.

Such a construction is particularly appropriate for accommodating the first and second regions in a commercial trench-gate context, and it permits the device to have a low on-resistance due to the high doping concentration of the first regions that provide the parallel current paths between the conduction channel and the drain region. The high doping concentration of the narrow first region may typically correspond to a dopant diffusion profile from the lower part of the trench into a body portion that provides the second region. This device construction is convenient for commercial manufacture.

Thus, in accordance with another aspect of the invention, there is provided a method of manufacturing a trench-gate device wherein, into a body portion of the second conductivity type, dopant of the first conductivity type is out-diffused from the trench, through at least a side wall of a lower part of a trench so as to form the first region. The doping concentration of the second region is provided by the body portion of the second conductivity type, which may be typically an epitaxial layer having, for example, a uniform doping concentration of the second conductivity type. The diffused dopant of the first conductivity type (out-diffused from, for example, a doped layer in the trench) provides the first region with a doping concentration of the first conductivity type that is higher than the doping concentration of the second conductivity type of the body portion. Its diffusion depth (measured perpendicular to the side wall of the trench)

is less than the remaining width of the body portion (measured perpendicular to said side wall) that provides the second region.

BRIEF DESCRIPTION OF THE DRAWING

These and other features in accordance with the present invention are illustrated in embodiments of the invention which are now to be described, by way of example, with reference to the accompanying drawings, in which.

Figure 1:
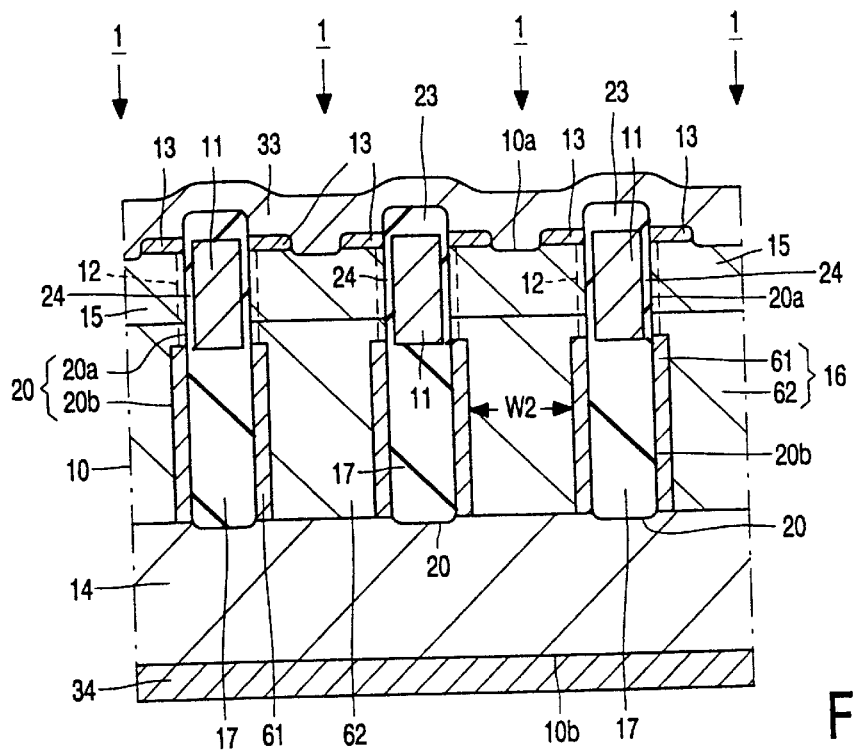
FIG. 1 is a diagrammatic cross-sectional view of an active central part of a cellular trench-gate semiconductor device in accordance with the invention.

It should be noted that FIGS. 1, 2, 3, 5 and 6 are diagrammatic, and their relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

FIG. 1 illustrates an exemplary embodiment of a trench-gate semiconductor device in the form of a cellular power MOSFET, comprising transistor cell areas 1 in a semiconductor body 10. Typically the device body 10 is of monocrystalline silicon. Each cell area 1 comprises a channel-accommodating region 15 of a second conductivity type (i.e. p-type in this example) between source and drain regions 13 and 14, respectively, of an opposite first conductivity type (n-type in this example). From a top major surface 10$a$ of the body, a trench 20 extends through the channel-accommodating region 15 and into an underlying body portion 16 between the channel-accommodating region 15 and the drain region 14. The trench-gate 11 is present in an upper part 20$a$ of the trench 20 and is capacitively coupled to the channel-accommodating region 15 adjacent to a side wall 21 of the upper part 20$a$ of the trench 20. The application of a voltage signal to the gate 11 in a conducting state of the device serves in known manner for inducing a conduction channel 12 (of electrons in this example) in the region portion 15$a$ and for controlling current flow in this conduction channel 12 between the source and drain regions 13 and 14. The source region 13 is located adjacent to the top major surface 10$a$ of the device body, where it is contacted by a source electrode 33. By way of example, FIG. 1 shows a MOSFET device structure in which the drain region 14 is a substrate region of high conductivity adjacent to the opposite major surface 10$b$, where it is contacted by a drain electrode 34.

This MOSFET is of the advantageous general device type described in U.S. Pat. No. 4,754,310, the ISPSD'98 paper and DE-A-197 36 981. Thus, the thick body portion 16 that carries a high voltage in an off-state of the device is not a single high-resistivity region. Instead, the body portion 16 comprises first regions 61 of the first conductivity type interposed with second regions 62 of the second conductivity type. In the conducting state of the device, the first regions 61 provide parallel current paths through the thick body portion 16, from the conduction channel 12 as illustrated in FIG. 1. In an off-state of the device, the thick body portion 16 carries a depletion layer 50 from the drain region 14 to the channel-accommodating region 15, for example as illustrated in broken outline in FIG. 2. The regions 61 and 62 each have a dopant content of their respective conductivity type that produces a balanced space charge in the body portion 16 when depleted in this off-state.

This voltage-sustaining body portion 16 is adjacent to a lower part 20$b$ of the trench 20, i.e. the trench 20 extends much deeper in the body 10 than the channel-accommodating region 15. In accordance with the present invention, the first region 61 of this body portion 16 is present between the second region 62 and the side wall 22 of the lower part 20$b$ of the trench 20. In fact, the lower part 20$b$ of the trench 20 carries the first region 61 through the body portion 16 to the drain region 14. This first region 61 has a doping concentration Nd of the first conductivity type that is higher than the doping concentration Na of the second conductivity type of the second region 62. A balanced space charge is nonetheless obtained between the regions 61 and 62, because the width W1 (measured perpendicular to the side wall 22) of this higher-doped first region 61 is appropriately less than the width W2 of the lower-doped second region 62.

The lower part 20$b$ of the trench 20 is adapted to interface with the adjacent body portion 16 comprising its interposed first and second regions 61 and 62. Thus, its dimensions and composition are chosen in accordance with the desired voltage handing characteristics of the device. The depth of the lower part 20$b$ of the trench 20 is determined in accordance with the desired thickness of the body portion 16, so as to accommodate the spread of the depletion layer 50 between the drain region 14 and the channel-accommodating region 15. The depth of the upper part 20$a$ of the trench 20 is determined in accordance with desired channel length, and hence the length of the trench-gate 11 in this upper part 20$a$, as well as the thickness of the channel-accommodating region adjacent thereto.

Typically, for devices designed to have moderate or high breakdown voltages, the depth of the lower part 20$b$ of the trench 20 is larger, for example an order of magnitude larger, than the depth of the upper part 20$a$ of the trench 20. Thus, the first region 61 typically has a length L6 that is longer, for example an order of magnitude longer, than the length L5 of the channel-accommodating region 15. These lengths L5 and L6 are measured in the depth direction of the trench 20, and adjacent to the respective upper and lower parts 20$a$ and 20$b$ of the trench 20. Thus, for example, the length L5 may be a few micrometers or less, whereas the length L6 may be more than 10 $\mu$m (micrometers), and even for example more than 20 $\mu$m or 30 $\mu$m or even 40 $\mu$m.

Figure 2:
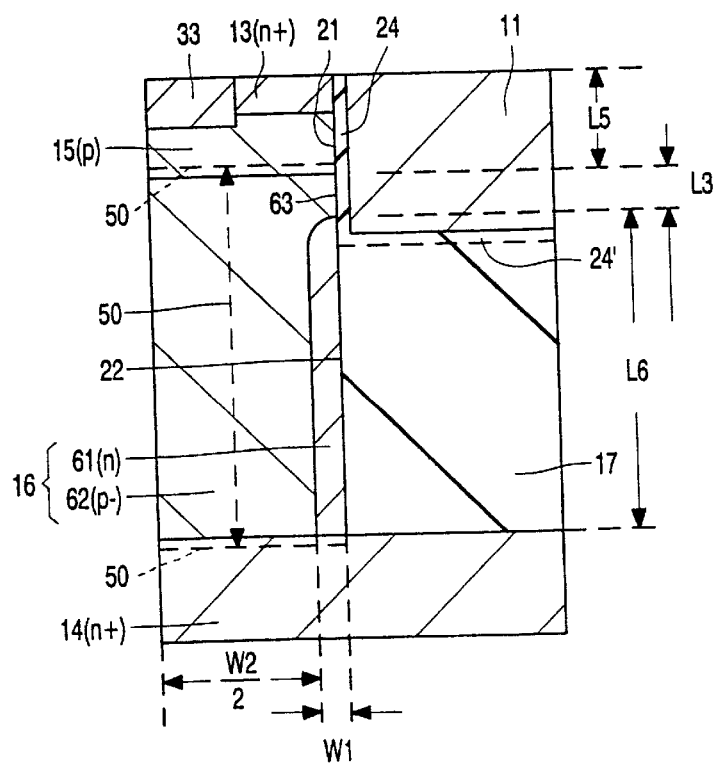
FIG. 2 is a simplified cross-sectional representation of half a cell of the device of FIG. 1, from the centre of one cell to the centre of the adjacent trench-gate.

As illustrated in FIG. 2, the first region 61 (adjacent to the lower part 20$b$ of the trench 20) may be spaced from the channel-accommodating region 15 by a part 63 of the second region 62. This part 63 extends adjacent to the upper part 20$a$ of the trench 20 where the trench-gate 11 is present. The gate 11 serves to induce an extension of the conduction channel 12 in this part 63 of the body portion 16. The inclusion of this low-doped part 63 serves to relieve the field between the facing edges of the moderately highly doped regions 15 and 61. The length L3 of this part 63 may be, for example, a few micrometers or less.

Typically, the lower part 20b of the trench 20 comprises a material 17 having of a dielectric nature at least adjacent the side wall 22 of the lower part 20b of the trench 20. This dielectric material 17 may be an insulating material, for example silicon dioxide, or it may be an undoped (intrinsic) semiconductor material or a low-doped semiconductor material of the second conductivity type (p-type in this example). Thus, the lower part 20b of the trench 20 may be filled with an insulating material 17, or it may comprise, for example, a semiconductor region 17 of the second conductivity type. This semiconductor region 17 may form a p-n junction with the adjacent first region 61 and is typically isolated from the gate 11 by an extension 24' of the gate insulating layer 24. However, the lower trench part 20b may comprise a low-doped semiconductor region 17' which is of the same conductivity type (n-type) as the side-wall adjacent region 61 and which is isolated from the gate 11. This low-doped n-type region 17' may adjoin the n-type region 61 and may fill the lower trench part 20b, or it may be separated from the n-type region 61 by a p-type region 17. The very low doping of such semiconductor regions 17 and 17' are such as to give an adequately balanced charge state in the space-charge region (when depleted together with the regions 61 and 62 in the voltage-sustaining off-state of the device), i.e. such that an electric field resulting from any imbalance is less that the critical field at which breakdown would occur in the semiconductor material.

The moderately high doping concentration of the narrow first region 61 typically corresponds to a dopant diffusion profile from the lower part 20a of the trench 20.

Thus, the device of FIG. 1 is manufactured by a method which includes the steps of:

etching a deep trench 20 into a body portion 60 (see FIG. 3) of the second conductivity type (p-type in this example) having a doping concentration Na for providing the second region 62, and out-diffusing dopant of the first conductivity type (n-type in this example) from the trench 20 into the body portion 60, through at least a side wall 22 of a lower part 20b of the trench 20, so as to form the first region 61.

A specific embodiment will now be described, in which the body portion 60 is a low-doped p-type epitaxial layer grown on the highly-doped n-type substrate region 14. This layer may have a uniform doping concentration Na. Alternatively, its doping concentration Na may, for example, increase towards the top surface 10a, if such an increasing doping concentration Na is desired for the regions 62. The channel-accommodating region 15 is a separately-doped region formed in this epitaxial layer by, for example, implantation of boron ions. The boron implantation into the epitaxial layer may be carried out either before or after etching and/or filling the trench 20.

Figure 3:
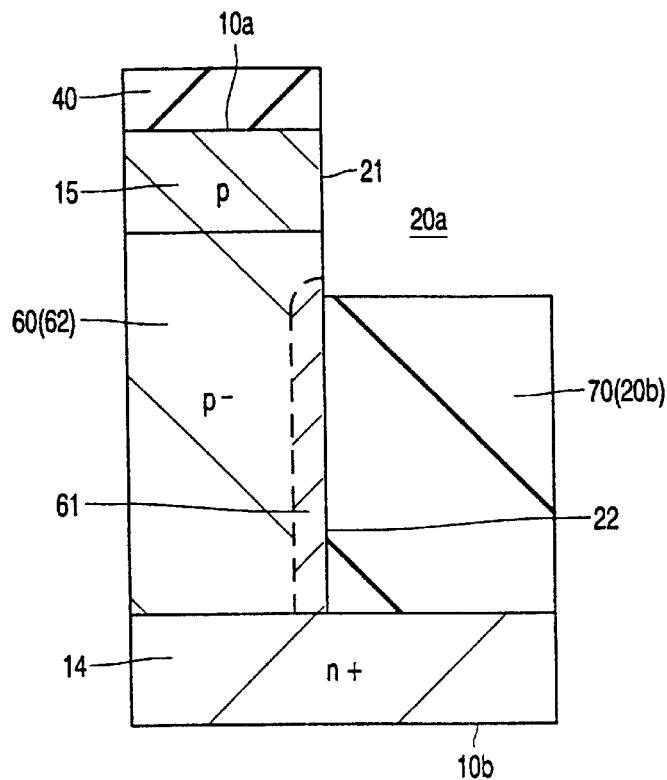
FIG. 3 is a similar representation to FIG. 2, but at a stage in the manufacture of the device using a method in accordance with the present invention.

FIG. 3 illustrates the situation in which the trench 20 is etched into the epitaxial layer after providing the region 15. The trench etchant mask 40 may still be present on the body during the outdiffusion of the regions 61. A doped material 70 is then deposited and etched back until the doped material 70 is left in only the lower part 20b of the trench 20. The doped material 70 may be the finally desired dielectric material 17, except that it also contains a donor dopant such as arsenic or phosphorus at this stage in the manufacture.

The semiconductor body is now heated to out-diffuse the donor dopant from material 70 to form the first region 61. The resulting first region 61 adjacent to the side wall 22 of the lower part 20b of the trench 20 has a doping concentration Nd of the first conductivity type that is higher than the doping concentration Na of the second conductivity type of the body portion 60. Its diffusion depth W1 (measured perpendicular to said side wall 22) is less than the remaining width W2 of the body portion 60 (also measured perpendicular to said side wall 22).

When a different dielectric material is desired in the lower part 20b of the trench, the material 70 is now etched from the trench 20 and replaced with the different material 17. The trench-gate 11 is then provided in the upper part 20a of the trench 20. Usually the capacitive coupling of the gate 11 to the channel-accommodating region 15 is via a gate insulating layer 24. In this case, a thermal oxidation process may be carried out in known manner to form the insulating layer 24 as silicon dioxide at the side walls 21 of the upper part 20a of the trench 20. When the dielectric material 17 is of undoped or low-doped silicon, then the silicon dioxide layer 24 formed by oxidation extends additionally at the upper face of the dielectric material 17. Conductively doped polycrystalline silicon is then deposited to provide the gate 11. This polycrystalline silicon is generally n-type for the present example of an N-channel device. Its upper suface is oxidised to form an insulating overlayer 23.

The n-type source region 13 is typically a dopant implanted surface region of arsenic or phosphorus in the semiconductor body 1. It may be formed after providing the trench-gate 11, or it may be a remaining part of an n-type layer formed at the body surface 10a before etching the trench 20. In yet another form when the gate 11 and overlayer 23 form a step at the top surface 10a, the source region 13 may be an n-type shoulder portion formed in a manner similar to that described in United States patent specification U.S. Pat. No. 5,378,655 (our ref: PHB33836), by etching back an n-type silicon layer deposited over this step.

The source and drain electrodes 33 and 34 are now provided, typically comprising aluminium. The source electrode 33 normally contacts the region 15, as well as the source region 13. For this purpose a window may be etched in the source region 13 before depositing the source electrode 33.

No plan view of the cellular layout geometry is shown in the drawings, because the invention may be used with quite different, known cell geometries. Thus, for example the cells 1 may have a square geometry as illustrated in FIG. 14 of U.S. Pat. No. 5,378,655, or they may have a close-packed hexagonal geometry or an elongate stripe geometry. The trench 20 (with its gate 11) may extend around the boundary of each cell 1. FIG. 1 shows only a few cells 1, but typically the device comprises many thousands of these parallel cells 1 between the electrodes 33 and 34. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells 1.

In a specific example of this embodiment of FIGS. 1 and 2, the doping concentrations of the various regions may be as follows:

of the order of $10^{15}$ cm$^{-3}$ for Na of the second region 62;

of the order of $10^{16}$ cm$^{-3}$ for Nd of the first region 61;

$10^{16}$ to $10^{17}$ cm$^{-3}$ boron doping for the channel-accommodating region 15;

an additional surface doping of $10^{18}$ to $10^{19}$ boron atoms cm$^{-3}$ where the region 15 is contacted by the source electrode 33, and $10^{20}$ to $10^{22}$ cm$^{-3}$ for phosphorus or arsenic doping of the source and drain regions 13 and 14.

As regards the doping content of the regions 61 and 62, a sufficient charge balance to avoid avalanche breakdown is required for the depleted regions 61 and 62. The critical field strength for monocrystalline silicon material is approximately $3\times10^5$ volts.cm$^{-1}$, and this corresponds to a fully depleted dopant dose of at most approximately $1\times10^{12}$ cm$^{-2}$. Thus, for the region 62 which is depleted from opposite sides by the two adjacent regions 61 of neighbouring trenches 20, the product (Na·W2) of the doping concentration Na and width W2 should be at most approximately $2\times10^2$ cm$^{-2}$, whereas for the region 61 adjacent to insulating material 17 in the trench 20, the product (Nd·W1) of the doping concentration Nd and width W1 should be at most approximately $1\times10^{12}$ cm$^{-2}$.

Figure 4:
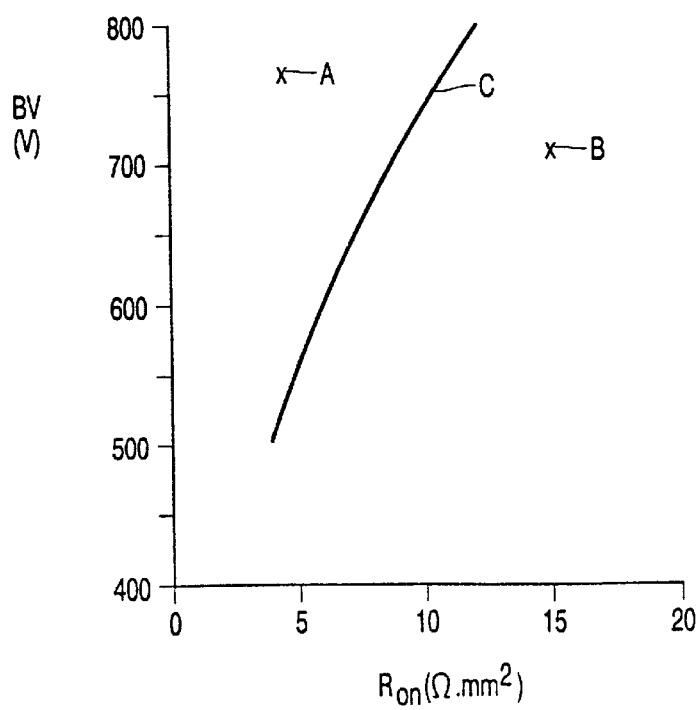
FIG. 4 is a graph of simulated device characteristics of breakdown voltage VB in volts and on-resistance Ron in ohm.mm$^2$, for a specific example of the device of FIGS. 1 and 2 (point A) and for a conventional device (point B)

FIG. 4 shows the results of numerical device simulations of the breakdown voltage VB in volts and on-resistance Ron in ohm.mm$^2$, for a conventional trench-gate device and for a specific example of the trench-gate device of FIGS. 1 and 2 in accordance with the invention. Both devices have a stripe cell geometry. The point A in FIG. 4 is for the device of FIGS. 1 and 2, in which:

L6 is 41 μm for region 61, adjacent an insulating region 17;

Nd is $1.65\times10^{16}$, and W1 is 0.5 μm for region 61;

Na is $2\times10^{15}$, and W2 is 9 μm for region 62; and the trench-gate 11 is 4 μm deep from the surface 10a, with the depth L5 of region 15 being 1.5 μm; and with L3 of 2 μm for part 63 of region 62, between the regions 15 and 61.

The breakdown voltage of this device in accordance with the invention is 760 volts with an on-resistance of 4.5 ohms.mm$^2$.

The point B is for a conventional device, in which the body portion 16 has a similar length to (L3+L6) but is composed of a single n-type epitaxial layer region having a doping concentration of $1.95\times10^{14}$ cm$^{-3}$. In this case, the trench-gate 11 is of the same depth as for the FIG. 1 device, but the trench 20' does not extend deeper into the body, i.e. the trench 20' does not extend through the depth of the body portion 16. The breakdown voltage of this conventional device is 710 volts with an on-resistance of about 15 ohms.mm$^2$.

The curve C shows the theoretical limit for a conventional device having its body portion 16 composed of a single high-resistivity region.

As stated above, a device in accordance with the present invention may have its n-type region 61 adjacent to a low-doped silicon region 17 in the lower part 20b of the trench 20. In this case, the region 61 is depleted from opposite sides by the two adjacent p-type regions 17 and 62, and so its doping concentration Nd can be slightly higher. Thus, the product (Nd·W1) of its doping concentration Nd and width W1 can be at most approximately $2\times10^{12}$ cm$^{-2}$.

Figure 5:
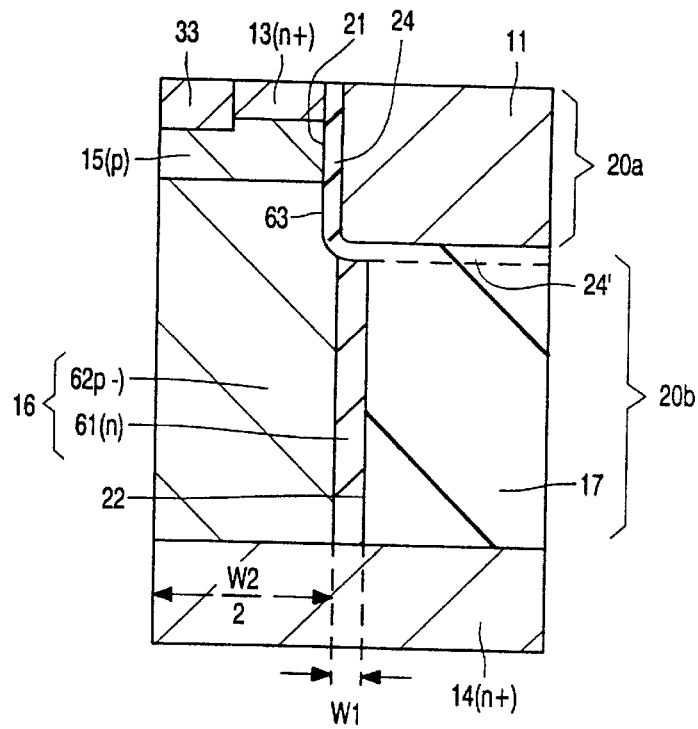
FIG. 5 is a similar simplified cross-sectional representation to FIG. 2, of half a cell of a modification of the device that is also in accordance with the present invention.

Many other modifications and variations are possible within the scope of the present invention. One such modification is illustrated in FIG. 5, in which the upper part 20a of the trench 20 is wider than the lower part 20b. This trench structure can be formed in a modification of the method illustrated in FIG. 3. In this modification, the doped material 70 may occupy both the lower and upper parts of the trench 20 during the out-diffusion of the n-type dopant Nd. In this case, the diffused first region 61 is formed not only adjacent to the lower sidewall 22, but also adjacent to the upper sidewall of the trench. The upper part of the trench is then widened by further etching, for example through the etchant mask 40, so as to remove the Nd doping from the sidewall of the now-widened upper part 20a of the trench. The gate 11 is subsequently provided in this widened upper part 20a, in the same manner as earlier described.

Figure 6:
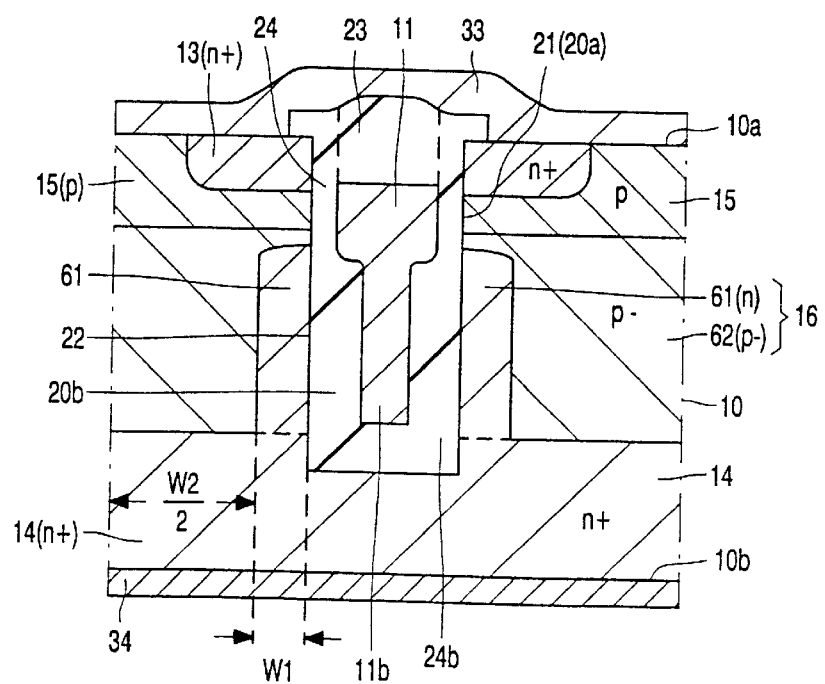
FIG. 6 is a diagrammatic cross-sectional view of an active central part of a variant cellular trench-gate semiconductor device, also in accordance with the invention.

FIG. 6 illustrates a further variant, that is a modification in accordance with the present invention of the process and trench-gate structure described in the United States patent specification U.S. Pat. No. 4,914,058. The whole contents of U.S. Pat. No. 4,914,058 are hereby incorporated herein as reference material. In the FIG. 6 device, both the gate 11 and the gate insulating layer 24 extend into the lower part 20b of the trench 20. The lower part 11b of the gate 11 acts as a field plate extension of the gate. The insulating layer part 24b in the lower trench part 20b is thicker than the gate insulating layer 24 in the upper trench part 20a. Thus, the capacitive coupling between the gate 11 and the first region 61 of the body portion 16 is reduced by this greater thickness of the insulating layer part 24b. In the manufacture of the device of FIG. 6, the upper and lower parts 20a and 20b of the trench 20 can be formed using process steps as described in U.S. Pat. No. 4,914,058. The upper trench part 20a can be first formed by etching, and then a gate insulating layer 24 of silicon dioxide and a lining of, for example, silicon nitride can be formed on the sidewalls of the trench part 20a. Subsequently, the lower trench part 20b can be formed by etching via the exposed bottom of the upper trench part 20a, as described in U.S. Pat. No. 4,914,058. Dopant material of the first conductivity type (n-type) is then deposited, and the first region 61 is formed by dopant outdiffusion from the lower trench part 20b. The side walls of the upper trench part 20a are masked against the dopant by the gate insulating layer 24 of silicon dioxide and the lining of silicon nitride. The thicker insulating layer part 24b is formed by, for example, oxidation of the lower trench part 20b. The gate material is then deposited on the insulating layer 24 in the whole trench 20 (both parts 20a and 20b).

An n-channel device has been described with reference to FIGS. 1 to 6. However, a p-channel device is also possible in accordance with the invention, in which the regions 13, 14 and 61 are p-type, the regions 15 and 62 are n-type, and the conduction channel 12 is of holes.

A vertical discrete device has been described with reference to FIGS. 1 to 6, having its drain electrode 34 contacting the drain region 14 at the back surface 10b of the body 10. However, an integrated device is also possible in accordance with the invention. In this case, the drain region 14 may be a doped buried layer between a device substrate and the epitaxial body region 60 (62) and may be contacted by electrode 34 at the front major surface 10a via a doped peripheral contact region which extends from the surface 10a to the depth of the buried layer.

The device illustrated in the drawings is a MOSFET in which the drain region 14 is connected ohmically to a drain electrode 34. The present invention may also be applied to IGBTs (insulated-gate bipolar transistors) of the trench-gate type, in which an emitter region of the opposite conductivity type is present between the drain region 14 and the corresponding main electrode 34 (usually called a "collector" electrode or "anode" electrode of the IGBT). This emitter region forms a p-n junction with a lower doped region 14 to modulate the conductivity of the regions 14 and 16 by carrier injection in the on-state of the IGBT.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to any such features and/or combinations of such features during the prosecution of the present Application or of any further Application derived therefrom.

What is claimed is:

1. A trench-gate semiconductor device comprising in a semiconductor body:
   a channel-accommodating region of a second conductivity type between source and drain regions of an opposite first conductivity type, the source region being adjacent to a major surface of the body;
   a trench that extends from the source region at the said major surface, through the channel-accommodating region and into an underlying body portion between the channel-accommodating region and the drain region;
   a gate that is present in an upper part of the trench and that is capacitively coupled to the channel-accommodating region adjacent to a side wall of the upper part of the trench for inducing a conduction channel in the channel-accommodating region in an on-state of the device;
   the said body portion being present adjacent to a lower part of the trench and comprising first regions of the first conductivity type that are interposed with second regions of the second conductivity type to carry a depletion layer from the drain region to the channel-accommodating region in an off-state of the device and to provide parallel current paths along the first regions in the on-state of the device;
   the current-path first region being located adjacent to the side wall of the lower part of the trench and thereby present between the second region and the lower part of the trench, and having a width measured perpendicular to said side wall that is less than the width of the second region, and having a doping concentration of the first conductivity type that is higher than the doping concentration of the second conductivity type of the second region; and
   wherein the improvement comprises an insulating layer of the second region that separates the current-path first region of the first conductivity type from the channel-accommodating region of the second conductivity type by extending downwardly and laterally to the side wall of the upper part of the trench where the gate is present;
   the insulating layer of the second region having a doping concentration of the second conductivity type that is lower than that of the channel-accommodating region and lower than the doping concentration of the first conductivity type of the current-path first region and that thereby provides field-relief between the channel-accommodating region and the current-path first region in the off state of the device.

2. A device as claimed in claim 1, wherein the said insulating layer of the second region extends laterally over the current-path first region and thereby provides a vertical spacing, at the side wall of the trench, of the channel-accommodating region of the second conductivity type from the underlying current-path first region of the first conductivity type.

3. A device as claimed in claim 1, wherein the gate is capacitively coupled to the channel-accommodating region and to the said spacer part of the second region via a gate insulating layer at the side wall of the trench, and wherein both the gate and the gate insulating layer extend into the lower part of the trench, with the gate insulating layer being thicker in the lower part of the trench than in the upper part so as to reduce the capacitive coupling between the gate and the current-path first region of the body portion.

4. A device as claimed in claim 1, wherein the upper part of the trench is wider than the lower part of the trench and extends laterally over the current-path first region that is located adjacent to the side wall of the lower part of the trench.

5. A device as claimed in claim 1, wherein the lower part of the trench is filled with insulating material.

6. A device as claimed in claim 1, wherein the lower part of the trench comprises a semiconductor region of the second conductivity type that forms a p-n junction with the current-path first region.

7. A device as claimed in claim 1, wherein, in the depth direction of the trench, the current-path first region has a length adjacent to the lower part of the trench that is longer (for example an order of magnitude longer) than that of the channel-accommodating region adjacent to the upper part of the trench.

8. A device as claimed in claim 1, wherein the current-path first region has a doping concentration of the order of $10^{16}$ cm$^{-3}$, and wherein the second region has a doping concentration of the order of $10^{15}$ cm$^{-3}$.

9. A device as claimed in claim 1, wherein the current-path first region has a doping concentration that corresponds to a dopant diffusion profile from the lower part of the trench and which is formed by etching the trench into a body portion of the second conductivity type having a doping concentration for providing the second region, and dopant of the first conductivity type is out-diffused from the trench into the body portion, through at least a side wall of a lower part of the trench, so as to form the first region adjacent to the side wall of the lower part of the trench with a doping concentration of the first conductivity type that is higher than the doping concentration of the second conductivity type of the body portion and with a diffusion depth measured perpendicular to said side wall that is less than the remaining width of the body portion measured perpendicular to said side wall.

10. A device as claimed in claim 1, wherein the second regions of the second conductivity type are regions of an epitaxial layer having a uniform doping concentration of the second conductivity type.

* * * * *